(12) United States Patent
Honigman et al.

(10) Patent No.: US 11,420,223 B2
(45) Date of Patent: Aug. 23, 2022

(54) HIGH PRESSURE SPRAY HEAD

(71) Applicant: VEECO INSTRUMENTS INC., Plainview, NY (US)

(72) Inventors: Steven Honigman, Plainview, NY (US); Kenji Nulman, Plainview, NY (US)

(73) Assignee: VEECO INSTRUMENTS INC., Plainview, NY (US)

( * ) Notice: Subject to any disclaimer, the term of this patent is extended or adjusted under 35 U.S.C. 154(b) by 67 days.

(21) Appl. No.: 16/434,831

(22) Filed: Jun. 7, 2019

(65) Prior Publication Data

US 2019/0381533 A1    Dec. 19, 2019

Related U.S. Application Data

(60) Provisional application No. 62/685,527, filed on Jun. 15, 2018.

(51) Int. Cl.
| | |
|---|---|
| *B05B 15/65* | (2018.01) |
| *B05B 1/00* | (2006.01) |
| *B05B 15/656* | (2018.01) |
| *B08B 3/02* | (2006.01) |

(52) U.S. Cl.
CPC .............. *B05B 15/65* (2018.02); *B05B 1/005* (2013.01); *B05B 15/656* (2018.02); *B08B 3/02* (2013.01)

(58) Field of Classification Search
CPC ....... B05B 15/65; B05B 1/005; B05B 15/656; B08B 3/02
See application file for complete search history.

(56) References Cited

U.S. PATENT DOCUMENTS

| | | | |
|---|---|---|---|
| 3,190,564 A | * | 6/1965 | Liedberg ............... B05B 1/34 239/578 |
| 3,441,223 A | | 4/1969 | Lapera |
| 3,887,137 A | | 6/1975 | Nakamura et al. |
| 4,258,885 A | | 3/1981 | Legeza |
| 4,736,893 A | | 4/1988 | Norskov |
| 4,930,704 A | | 6/1990 | Chen |
| 5,595,346 A | * | 1/1997 | Haruch ............... B05B 7/0458 239/431 |
| 5,732,886 A | | 3/1998 | Liaw |
| 5,829,682 A | | 11/1998 | Haruch |
| 6,193,172 B1 | | 2/2001 | Soule et al. |
| 6,669,112 B2 | * | 12/2003 | Reetz, III ........... B05B 7/0815 239/290 |
| 7,818,829 B2 | | 10/2010 | Moretto |
| 9,789,498 B2 | | 10/2017 | Fu et al. |
| 2008/0217435 A1 | | 9/2008 | Whittaker et al. |
| 2009/0194611 A1 | | 8/2009 | Whittaker et al. |
| 2013/0341423 A1 | | 12/2013 | Dziubasik et al. |

* cited by examiner

*Primary Examiner* — Steven M Cernoch
(74) *Attorney, Agent, or Firm* — Leason Ellis LLP

(57) ABSTRACT

A device for spraying substrates comprises a longitudinal extending fluid dispensing head coupled to a supply of fluid and including a perpendicularly extending flange, a spacer having first and second ends, the first end of the spacer coupled to the extending flange of the dispensing head, a nozzle adapted to eject fluid coupled to the second end of the spacer, and a locking nut enclosing the spacer and securely the dispensing head, spacer and nozzle.

14 Claims, 4 Drawing Sheets

HIGH PRESSURE SPRAY HEAD

CROSS-REFERENCE TO RELATED PATENT APPLICATIONS

This application is based on and claims priority to U.S. Provisional Patent Application 62/685,527, filed Jun. 15, 2018, the entire contents of which is incorporated by reference herein as if expressly set forth in its respective entirety herein.

FIELD OF THE INVENTION

The present invention relates to semiconductor fabrication equipment, and in particular, relates to a high pressure spray head that includes extension which allows sprays to be applied at optimal distances from a wafer surface.

BACKGROUND OF THE INVENTION

Photoresist removal is a common process used during semiconductor fabrication. This process is used to remove a patterned layer of photoresist including any material deposited on top of the patterned photoresist layer. Photoresist removal can be performed in a number of different ways, with one advantageous technique, discussed in commonly-owned U.S. Pat. No. 9,541,837, involving two successive stages of solvent bath immersion and high pressure spraying. The solvent baths dissolve and loosen photoresist material and the high pressure sprays dislodge the loosened material from the substrate.

The removal process can be made more challenging when a hardened crust has formed on the top of the photoresist layer, as sometimes occurs due to doping. The parameters of the solvent bath immersion, such as the concentration of the solvent and duration of immersion, as well as the parameters of the spraying, such as the fluid pressure, spraying configuration (e.g., fan-shaped versus needle-shaped), and distance of the spray nozzle from the substrate, need to be suitably controlled to remove the hardened material.

It is believed that the current sprayers in use can be improved upon with regard to their flexibility, so that they can be readily adapted to removal photoresist layers having a range of different hardness and other characteristics. It is with respect to these and other considerations that the disclosure made herein is presented.

SUMMARY OF THE INVENTION

Embodiments of the present invention provide a device for spraying substrates that comprises a longitudinal extending fluid dispensing head coupled to a supply of fluid and including a perpendicularly extending flange, a spacer having first and second ends, the first end of the spacer coupled to the extending flange of the dispensing head, a nozzle adapted to eject fluid coupled to the second end of the spacer, and a locking nut enclosing the spacer and securely the dispensing head, spacer and nozzle.

Some embodiments of the spray device further comprise a first O-ring for sealing an interface between the dispensing head and the spacer. Some implementations thereof include a second O-ring for sealing an interface between the spacer and the nozzle.

In some embodiments, the spacer includes seats for receiving the first and second O-rings. The dispensing head can also include a seat for receiving the first O-ring.

These and other aspects, features, and advantages can be appreciated from the following description of certain embodiments of the invention and the accompanying drawing figures and claims.

DETAILED DESCRIPTION OF CERTAIN EMBODIMENTS OF THE INVENTION

Embodiments of the present invention provide a spray head adapted to dispense fluid at a high pressure for dislodging materials from wafer substrates. The spray head includes an arm oriented to direct a spray onto a substrate. The arm includes an extension that provides an improved range of spray distances and can be positioned more closely to the surface of a substrate. In some embodiments, the spray arm with extensions can be positioned at a height of about 0.325 to about 1.125 inches.

Figure 1:
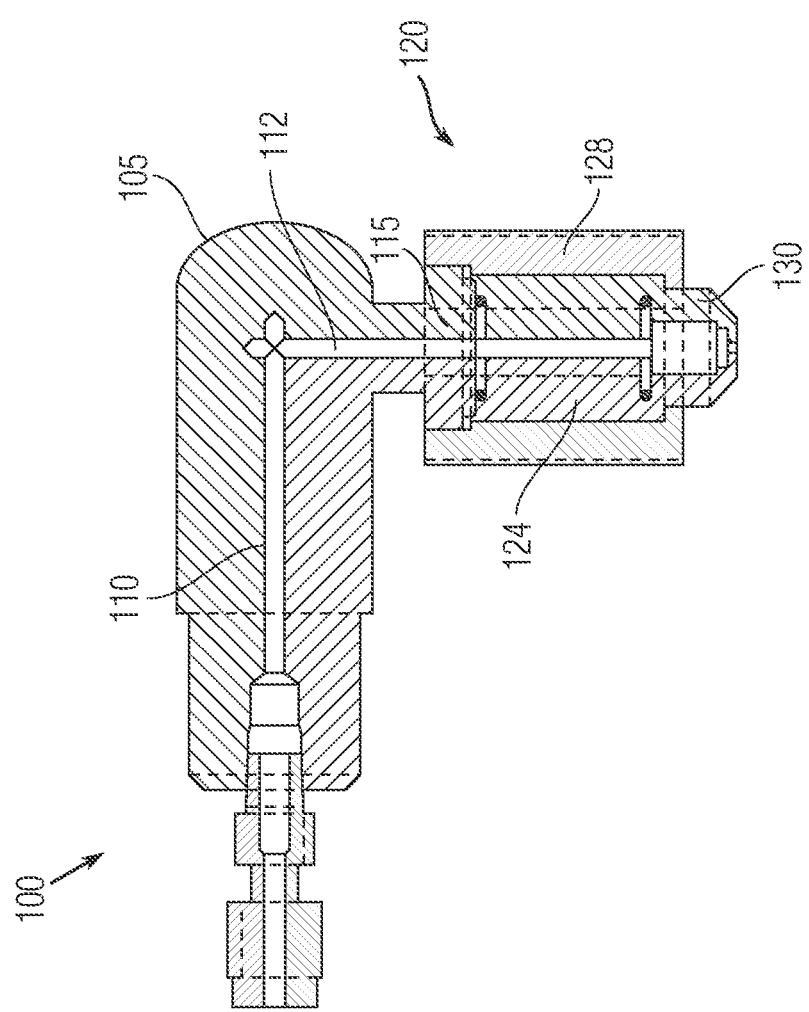
FIG. 1 is cross-sectional view of a spray head according to an embodiment of the present invention.
Figure 3:
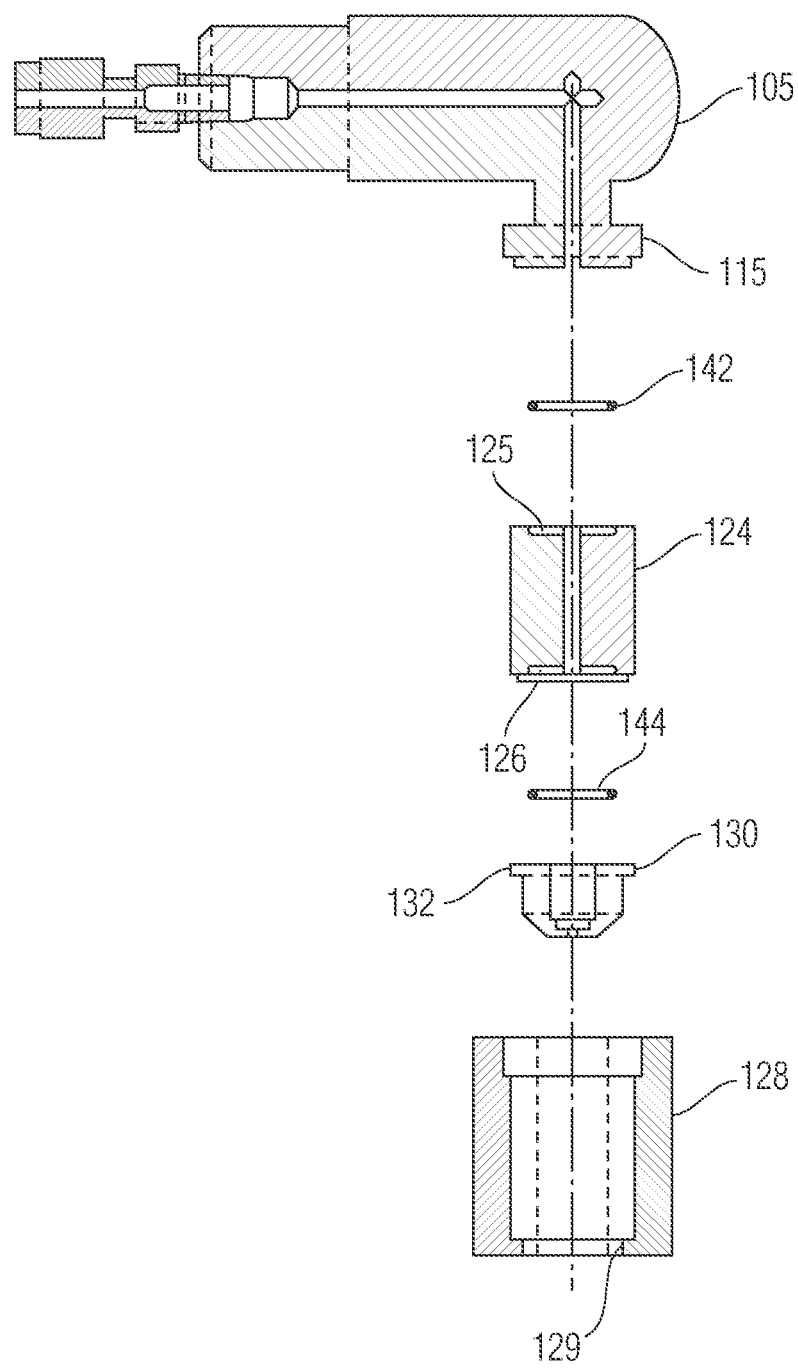
FIG. 3 is a transparent perspective view of the spray head shown in FIGS. 1 and 2.

FIG. 1 is a cross-sectional view of a spray head 100 according to an embodiment of the present invention. Spray head 100 is adapted to dispense fluid at a high pressure for dislodging materials from wafer substrates. The spray head 100 includes a longitudinally extending dispensing head section 105 containing a first fluid flow conduit 110. Dispensing head 105 is coupled to a fluid supply at a first longitudinal end, and, at a second longitudinal end, includes an arm flange 115 that can extend perpendicularly. As shown in FIG. 3, the first longitudinal end can include a first connector 119 that is configured to be coupled to the first longitudinal end of the dispensing head section 105 and coupled to the fluid supply. The first connector 119 includes a conduit formed therein which is in fluid communication with the first fluid flow conduit 110.

A second fluid conduit 112 extends within the dispensing head 105 from an end of the first conduit 110 through the arm flange. The second fluid conduit 112 is thus in fluid communication with the first fluid flow conduit 110. Alternatively, the first connector 119 can be eliminated and the fluid supply can be directly connected to the first longitudinal end of the dispensing head 110 as by tubing or the like. For example, the first longitudinal end can include a nipple or the like to which the tubing is attached.

Spray head 100 also includes an arm extension 120 that couples the dispensing head 105 to a nozzle 130 through which fluid exits the spray head. As described herein, the arm extension 120 provides a means for altering the position of the fluid ejection site (spray location) relative to the dispensing head 105. As described herein, the arm extension 120 can be customized and can come in different sizes so as to allow the length of the arm extension 120 to be altered and to also potentially change the dimension of the conduit through which the fluid travels to the spray site.

Figure 2:
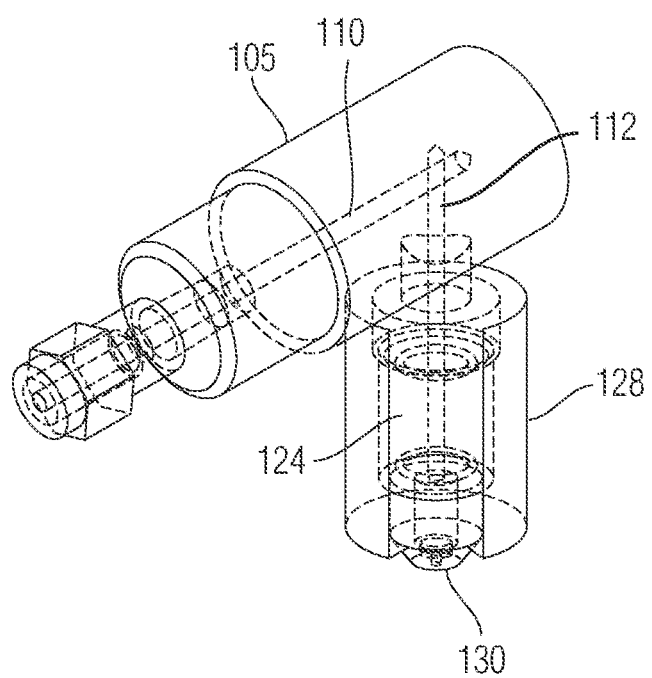
FIG. 2 is an exploded view of a spray head according to an embodiment of the present invention.

The extension 120 includes a spacer 124 coupled at a first end to arm flange 115 and at a second end to nozzle 130, effectively increasing the distance between the dispensing head 105 and the nozzle 130. The assembly of the flange, spacer and nozzle is fastened and secured by a hollow locking nut 128 (distal enclosure or sleeve that covers the spacer). In some embodiments, the locking nut 128 snugly surrounds arm flange 115, spacer 124 and the top of nozzle 130 to ensure that fluid cannot escape through the joints between the components of the extension 120. In certain embodiments, all of the components of the spray head are composed of stainless steel, although other materials can be used. FIG. 2 is a transparent perspective view of the spray head 100 shown in FIG. 1. For example, the arm flange 115 can include outer threads, while the locking nut 128 can include inner threads that mate with the outer threads to attach the locking nut 128 to the arm flange 115. Other techniques can be used to couple the locking nut 128 to the arm flange 115. For example, a quick-connect type connection can be provided for detachably attaching the arm extension 120 to the dispensing head 105.

FIG. 3 is an exploded view of a spray head that illustrates one implementation of how the parts of the spray head can be securely coupled together. As shown, the bottom of the arm flange 115 of dispensing head 105 rests upon a first O-ring 142 which serves as a sealant. The O-ring 142 in turn sits on an annular seat 125 recessed on the top surface of spacer 124. In some embodiments, the arm flange 115 can include a corresponding annular seat 117 for first O-ring 142, shown in FIG. 4 resulting in the O-ring 142 being partially received within the annular seat 125 and also within the annular seat 117. The annular seat 117 can thus be in the form of an annular groove or channel. On the opposite site of spacer 124 is a second annular seat 126 for a second O-ring 144. The second O-ring 144, in turn, fits snugly on an upper rim of nozzle 130. The spacer 124 and nozzle 130 are enclosed snugly within locking nut 128. The nozzle includes a top flange 132 adapted to sit upon a corresponding flange 129 at the bottom of locking nut 128.

In operation, the extension allows the arm to be moved to an optimal distance at which a high pressure spray ejected from the nozzle 130 removes most unnecessary material from the wafer. In some embodiments, the spacer 124 allows the nozzle 130 to be positioned in a range of about 0.325 inches to about 1.125 inches, with a mean of approximately 0.75 inches.

It will also be understood that the teachings described herein can be used in a wide variety of different applications, including but not limited to, photoresist removal, metal lift off or other suitable material removal process. One such process is described in U.S. Pat. No. 9,541,837, which is hereby incorporated by reference in its entirety.

Figure 4:
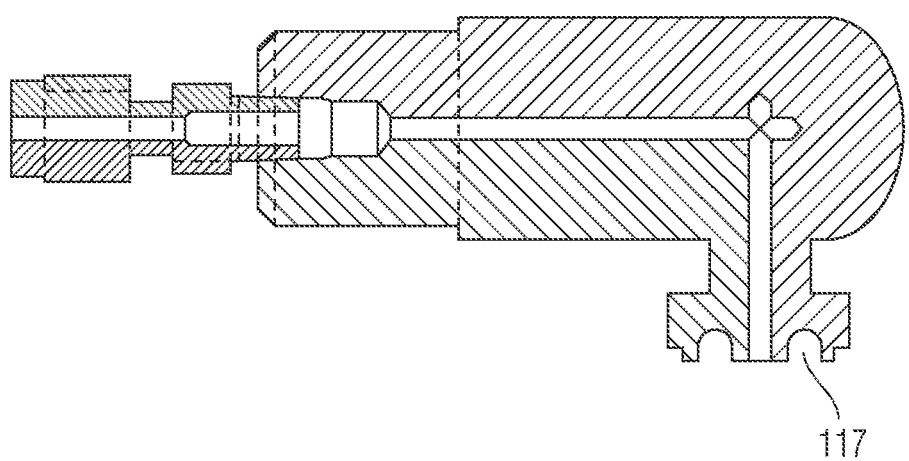
FIG. 4 is a cross-sectional view of another embodiment of a dispensing head according to the present invention.

As described herein, there are a number of different alternative configurations that can be used. For example, the O-ring can be eliminated from the arm flange 115 and be present in the annular seat 125. As shown in FIG. 4, there can be a shallow O-ring groove 117 and a shallow 0-ring groove 125 into which the O-ring seats. Alternatively, the O-ring groove 117 can be deeper and the O-ring groove 125 can be eliminated. In addition, in yet another embodiment, the spacer (insert) 124 can be eliminated and the illustrated locking nut 128 can have a shorter length (height) and groove 117 is provided to receive an O-ring that seats to nozzle 130. In addition, the spacer 124 and the locking nut 128 can be formed to have any suitable lengths whereby seals 142, 144 seal the respective parts properly. Moreover, it will be understood that the nozzle 130 can be any suitable nozzle type, such as a fan spray, needle spray, high pressure, low pressure, or otherwise.

It is to be understood that any structural and functional details disclosed herein are not to be interpreted as limiting the systems and methods, but rather are provided as a representative embodiment and/or arrangement for teaching one skilled in the art one or more ways to implement the methods.

It is to be further understood that like numerals in the drawings represent like elements through the several figures, and that not all components and/or steps described and illustrated with reference to the figures are required for all embodiments or arrangements The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Terms of orientation are used herein merely for purposes of convention and referencing, and are not to be construed as limiting. However, it is recognized these terms could be used with reference to a viewer. Accordingly, no limitations are implied or to be inferred.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

While the invention has been described with reference to exemplary embodiments, it will be understood by those skilled in the art that various changes can be made and equivalents can be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A device for spraying substrates comprising:
    a longitudinal extending fluid dispensing head configured to be coupled to a supply of fluid and including an integral outwardly extending flange, the fluid dispensing head and outwardly extending flange being formed as a single part;
    a spacer having opposite first and second ends, the first end of the spacer disposed in an abutting relationship with an exposed end of the outwardly extending flange of the longitudinal extending fluid dispensing head;
    a nozzle adapted to eject fluid disposed proximate the second end of the spacer; and
    a locking nut enclosing, directly contacting and holding the spacer in place and securely coupling the longitudinal extending fluid dispensing head, spacer and nozzle to one another, wherein a first end of the locking nut has a first region having a first width and defined by a first shoulder, the outwardly extending flange seating within the first region against the first shoulder and the locking nut having an intermediate region in which the spacer is disposed, the intermediate region having a second width and being defined by a second shoulder, the nozzle seating against the second shoulder, the locking nut having a second region at a second end of the locking nut with the intermediate region being disposed between the first region and the second region, the second region having a third width, the locking nut surrounding an outermost surface of the outwardly extending flange, the outwardly extending flange and the spacer being located in series with one another and the spacer is completely contained within the locking nut between the first and second shoulders and wherein the first width, the second width and the third width are different from one another.

2. The device of claim 1, wherein the dispensing head includes a first conduit extending longitudinally along a base portion of the longitudinal extending fluid dispensing head and a second conduit that extends within the outwardly extending flange and is oriented perpendicular to the first conduit.

3. The device of claim 1, further comprising a first O-ring for sealing an interface between the outwardly extending flange of the longitudinal extending fluid dispensing head and the first end of the spacer.

4. The device of claim 3, further comprising a second O-ring for sealing an interface between the second end of the spacer and the nozzle.

5. The device of claim 4, wherein the spacer includes first and second seats for receiving the first and second O-rings, respectively.

6. The device of claim 5, wherein the spacer has a center bore formed therein and the first seat comprises a first recess formed at the first end of the spacer and the second seat comprises a second recess formed at the second end of the spacer.

7. The device of claim 1, wherein the locking nut includes a center bore formed therein, the second shoulder surrounding the center bore at the second end of the locking nut, the nozzle having a top flange that seats against the second shoulder for supporting the nozzle such that the top flange is disposed entirely within the center bore, while a distal end portion of the nozzle is disposed outside of and distal to the locking nut.

8. The device of claim 1, wherein the outwardly extending flange includes outer threads and the locking nut includes inner threads that mate with the outer threads.

9. The device of claim 1, wherein the first width>the second width>the third width.

10. The device of claim 3, wherein a free distal end of the outwardly extending flange has a first annular seat formed therein and the first end of the spacer includes a second annular seat, the first O-ring being received within the first annular seat and the second annular seat.

11. The device of claim 10, wherein the free distal end comprises a bottom surface of the outwardly extending flange and the first annular seat is open along the bottom surface of the outwardly extending flange.

12. The device of claim 11, wherein the first annular seat comprises a concave shaped groove that is formed in the bottom surface and is open along the bottom surface.

13. The device of claim 1, wherein the outwardly extending flange is completely contained within the first region of the locking nut.

14. A device for spraying substrates comprising:
a longitudinal extending fluid dispensing head configured to be coupled to a supply of fluid and including an outwardly extending flange that has a bottom surface in which a first annular seat is formed, the first annular seat comprising a concave shaped groove formed in the bottom surface, the concave shaped groove defined by an outer annular wall and an inner annular wall with a curved ceiling extending between the outer annular wall and the inner annular wall that are parallel to one another;
a first O-ring disposed within the concave shaped groove between the outer annular wall and the inner annular wall;
a spacer having first and second ends, the first end of the spacer disposed adjacent the outwardly extending flange of the longitudinal extending fluid dispensing head, the spacer including a first recessed annular seat formed at the first end and surrounding a center bore formed in the spacer and a second recessed annular seat formed at the second end and surrounding the center bore, the first O-ring seating against the first end of the spacer and being disposed within the first recessed annular seat, wherein the first recessed annular seat is defined by an outer perimeter wall of the spacer that surrounds the first recessed annular seat in which the first O-ring is seated and thus the outer perimeter wall is located radially outward from the first O-ring;
a second O-ring disposed within the second recessed annular seat;
a nozzle adapted to eject fluid disposed proximate the second end of the spacer; and
a locking nut enclosing and holding the spacer in place and securely coupling the longitudinal extending fluid dispensing head, spacer and nozzle to one another.

* * * * *